United States Patent

Grimm et al.

[11] Patent Number: 5,574,620
[45] Date of Patent: Nov. 12, 1996

[54] ELECTRICAL COMPONENT RESISTANT TO DAMAGE BY INFRARED RADIATION

[75] Inventors: Wilhelm Grimm, Roth; Reinhard Sperlich, Kolbermoor, both of Germany

[73] Assignee: Siemens Matsushita Comp. GmbH & Co. KG, Munich, Germany

[21] Appl. No.: 415,936

[22] Filed: Apr. 3, 1995

[30] Foreign Application Priority Data

May 5, 1994 [DE] Germany ................... 44 15 950.1

[51] Int. Cl.⁶ ............................................. H01G 4/30
[52] U.S. Cl. ............... 361/282; 361/301.4; 361/301.5; 361/306.3; 361/313
[58] Field of Search ......................... 361/272, 321.2, 361/301.4, 301.5, 306.3, 313; 29/25.47; 257/787

[56] References Cited

U.S. PATENT DOCUMENTS

| | | | |
|---|---|---|---|
| 3,891,901 | 6/1975 | Booe et al. | 317/258 |
| 4,636,162 | 12/1982 | Price | 29/25.42 |
| 5,317,195 | 5/1994 | Ishikawa et al. | |

FOREIGN PATENT DOCUMENTS

| | | |
|---|---|---|
| 0274786 | 7/1988 | European Pat. Off. |
| OS1439365 | 2/1969 | Germany |
| OS1564144 | 12/1969 | Germany |
| OS2348218 | 4/1975 | Germany |
| PS1464641 | 4/1979 | Germany |
| OS3821592 | 4/1989 | Germany |
| OS4024673 | 2/1992 | Germany |

OTHER PUBLICATIONS

Patent Abstracts of Japan, vol. 11, No. 88 (E–490), Japanese Application JP850082501, Published Oct. 28, 1986.
Patent Abstract of Japan, vol. 11, No. 254 (E–533), Japanese Application JP850204212, Published Mar. 24, 1987.

*Primary Examiner*—Leo P. Picard
*Assistant Examiner*—Anthony Dinkins
*Attorney, Agent, or Firm*—Hill, Steadman & Simpson

[57] ABSTRACT

In an electrical component that contains materials that can physically and/or chemically change under the influence of heat (infrared) radiation required during processing of the component and which in particular, is suitable for employment on printed circuits, a surface layer that reflects the heat (infrared) radiation is arranged at the outside of the component.

12 Claims, 1 Drawing Sheet

5,574,620

ELECTRICAL COMPONENT RESISTANT TO DAMAGE BY INFRARED RADIATION

BACKGROUND OF THE INVENTION

1. Field of the Invention

The present invention is directed to an electrical component that contains materials which can physically and/or chemically change under the influence of heat (infrared) irradiation of the type required during circuit assembly steps involving the component and which, in particular, is suitable for employment on printed circuits.

2. Description of the Prior Art

Fastening electrical components on printed circuit boards ensues, for example, with a reflow soldering. The printed circuit board together with the components arranged thereon are heated by infrared radiation to such an extent that the solder melts and produces the required, reliable electrical and mechanical connection between the components and the metallic interconnects. In the case of components having heat-sensitive materials, for example electrical capacitors having plastic films, special care is therefore required to insure that the materials are not damaged or modified due to the heating produced by the infrared radiation. For example, there is a risk that the plastic foils (of, for example, polyethylene terephthalate) in the capacitors may melt under the influence of heat, so that the electrical values of the capacitor are changed.

A further heat treatment with infrared radiation takes place in what are referred to as pre-heating paths (drying paths for fluxing agent) wherein the above-recited risks for electrical components can likewise occur.

Heretofore, one could only attempt to minimize these difficulties in the heat treatment of the electrical components with infrared radiation by correctly observing the maximum temperatures and maximum treatment times prescribed by the manufacturer. A risk of damage is still present, however, because exact predictions about the effects of heating components with infrared irradiation are difficult to make, since the localized heating is dependent on many parameters (for example, spacing, wavelength and energy of the radiation, reflection and absorption at the component, etc.). Damage to the component cannot be precluded even given the greatest possible care.

SUMMARY OF THE INVENTION

It is an object of the present invention to improve a component of the type initially described such that undesired heating by infrared radiation is diminished.

This object is inventively achieved in an electrical component having a surface layer that reflects the heat (infrared) radiation disposed on the outside of the component.

The advantage is thereby achieved that an absorption of the infrared radiation in the component is avoided to a great extent, and thus the undesired heating is prevented.

The reflective layer is preferably composed of a metallization (for example, of aluminum) that is arranged on a plastic film, or directly on the component, or is composed of a metal foil.

The electrical component is preferably a layered or stacked capacitor, or a wound capacitor, that has possibly been pressed flat.

The electrical component can have contact surfaces at its end faces that are manufactured according to Schoop's metal spraying process. The reflective layer thereby preferably has at least one side with a free edge that is arranged in the region of a Schoop layer.

DESCRIPTION OF THE PREFERRED EMBODIMENTS

Figure 1:
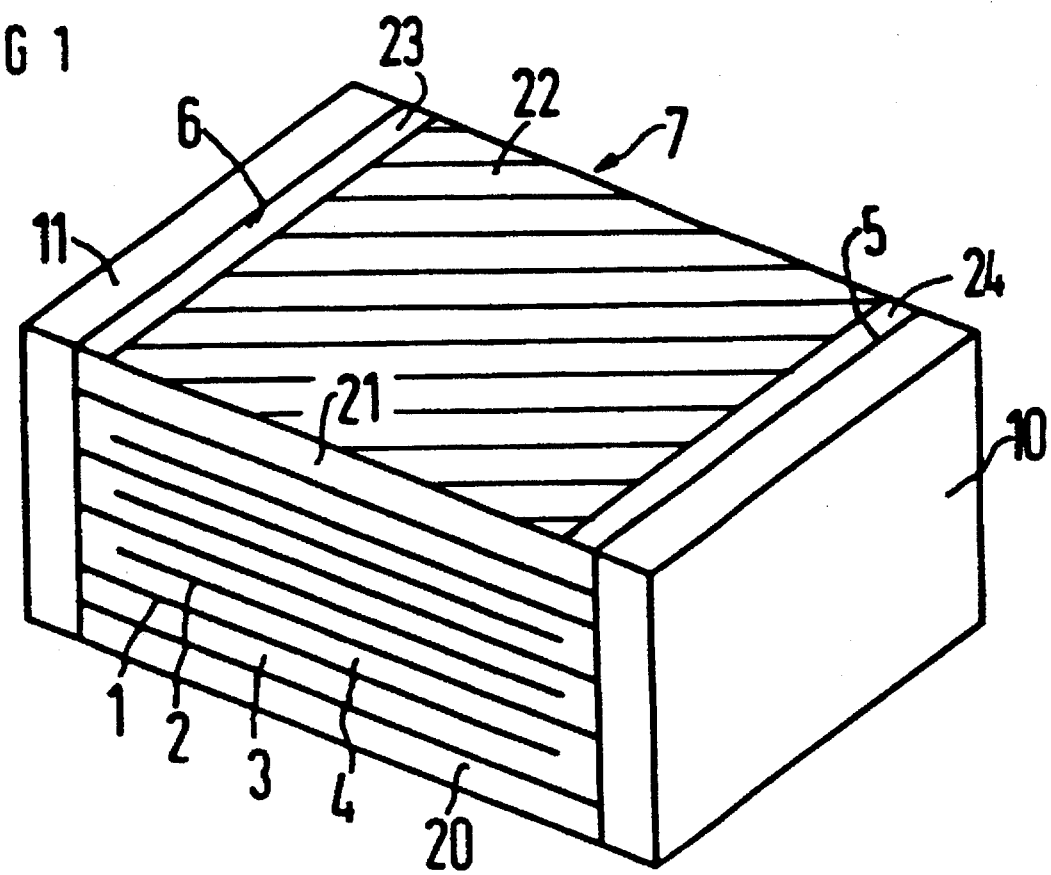
FIG. 1 shows layered or stack capacitor constructed in accordance with the principles of the present invention.

FIG. 1 shows a capacitor body 7 as a stacked or layered capacitor. The capacitor body 7 is composed of dielectric films 3 and 4 arranged above one another that have at least one side provided with regeneratable metal layers 1 and 2.

Contact layers 10 and 11 are arranged at the end faces 5 and 6 of the capacitor body 7. These contact layers are produced, for example, according to Schoop's metal spraying method and serve the purpose of electrically connecting the metal layers 1 and 2 that extend to the end faces 5 and 6 in alternation to one another.

Plastic foils 20 and 21 are arranged at the outside of the capacitor body 7, these plastic foils 20 and 21 having a surface layer 22 produced, for example, by vapor-deposition that reflects heat (infrared) radiation. If the layer 22 is metallic, metal-free edge strips 23 and 24 are arranged at the sides that prevent shorts between the oppositely polarized contact layers 10 and 11. Shorts can also be prevented by separating the potential in the surface 22.

The plastic films 20 and 21 together with the surface layers 22 are expediently co-wound to form the winding during the manufacture of the master capacitor from which the individual components are cut.

Figure 2:
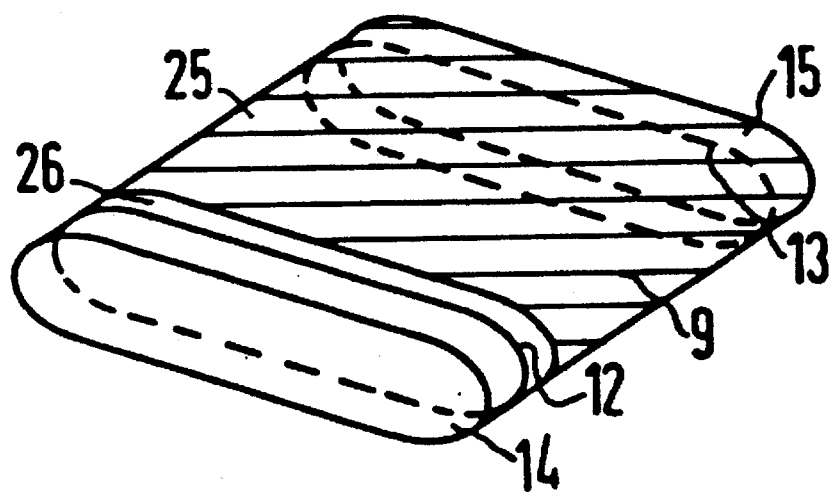
FIG. 2 shows a capacitor having a winding pressed flat as capacitor body constructed in accordance with the principles of the present invention.

FIG. 2 shows another embodiment wherein the capacitor body 9 is composed of a winding that has been pressed flat. The regeneratable metal layers that are not visible in FIG. 2 are also applied onto plastic films in this capacitor and are conducted to the end faces 12 and 13 in alternation and are connected to one another at that location by the contact layers 14 and 15.

A surface layer 25 that reflects heat (infrared) radiation is arranged at the outside of the capacitor body 9, this surface layer 24 being produced, for example, by direct vapor-deposition of a metal (for example, aluminum) onto the capacitor body 9. A metal-free edge strip 26 is arranged parallel to the contact layer 14 in order to avoid shorts between the contact layers 14 and 15. As in the exemplary embodiment shown in FIG. 1, shorts between the contact layers 14 and 15 given a capacitor body 9 that has been pressed flat can also be prevented by a separation of potential in the surface 25.

In addition to the embodiments shown in the drawings, of course, other versions of surface layers are also possible. Given an insulating covering of the contact layers, thus, the surface layer can cover the entire exterior of the capacitor since shorts cannot arise in that case. It is also possible to cover the sides, which become exposed in film or layered capacitors due to detachment from the master capacitor with a reflective layer. It should be taken into consideration, however, that the majority of the heat radiation is received by the outside surface of the component facing away from the printed circuit board, so that covering this surface is fundamentally adequate in most applications. Since, however, a distinction between an upper side and an under side, i.e. the exterior side facing toward or, respectively, away from the printed circuit board, is not possible given modern machine-equipping methods, at least these two sides (the upper side and under side in FIGS. 1 and 2) should be protected by a surface layer.

The subject matter of the invention thus assures that a substantial preservation of the components is achieved when treating heat-sensitive, electrical components with infrared radiation, so that a destruction of the components is avoided even given inconsistent treatment times.

Although modifications and changes may be suggested by those skilled in the art, it is the intention of the inventors to embody within the patent warranted hereon all changes and modifications as reasonably and properly come within the scope of their contribution to the art.

We claim as our invention:

1. An electrical component employable in an environment wherein said component is exposed to infrared radiation comprising:

a plurality of internal components susceptible to damage by infrared radiation; and a surface layer disposed at an exterior of said internal components which reflects infrared radiation.

2. An electrical component as claimed in claim 1 wherein said surface layer comprises a metallization disposed on a plastic film surrounding said internal components.

3. An electrical component as claimed in claim 1 wherein said metallization comprises aluminum.

4. An electrical component as claimed in claim 1 wherein said component comprises a body with an exterior, and wherein said surface layer comprises a metallization applied directly onto said exterior of said body.

5. An electrical component as claimed in claim 4 wherein said metallization comprises aluminum.

6. An electrical component as claimed in claim 1 wherein said surface layer comprises a metal foil.

7. An electrical component as claimed in claim 1 wherein said interior components form a film capacitor.

8. An electrical component as claimed in claim 1 wherein said interior components form a stacked capacitor.

9. An electrical component as claimed in claim 1 wherein said interior components form a wound capacitor.

10. An electrical component as claimed in claim 1 wherein said wound capacitor is pressed flat.

11. An electrical component as claimed in claim 1 further comprising a body having end faces, and respective contact surfaces disposed at said end faces produced by Schoop's metal spraying.

12. An electrical component as claimed in claim 11 wherein said surface layer has a free edge disposed at a side of said surface layer adjacent one of said contact surfaces.

* * * * *